(12) United States Patent
Pincek et al.

(10) Patent No.: US 8,220,652 B2
(45) Date of Patent: Jul. 17, 2012

(54) POWER SUPPLY SUPPORT SYSTEM

(75) Inventors: David Pincek, Huntington Beach, CA (US); Carlo Espiritu, Orange, CA (US); Jeff Hatley, Mebane, NC (US); Nerio Perez, Torrance, CA (US); Stanley S. Coe, Raleigh, NC (US)

(73) Assignee: RGB Systems, Inc., Anaheim, CA (US)

( * ) Notice: Subject to any disclaimer, the term of this patent is extended or adjusted under 35 U.S.C. 154(b) by 1386 days.

(21) Appl. No.: 11/888,346

(22) Filed: Jul. 31, 2007

(65) Prior Publication Data

US 2009/0033184 A1 Feb. 5, 2009

(51) Int. Cl.
*H02G 3/08* (2006.01)

(52) U.S. Cl. ......... 220/4.02; 220/3.2; 220/3.9; 220/737; 220/743; 248/218.4; 248/311.2; 312/223.1; 206/701

(58) Field of Classification Search ............ 220/3.2, 220/3.9, 4.02, 737, 743; 312/223.1; 248/218.4, 248/311.2; 206/701

See application file for complete search history.

(56) References Cited

U.S. PATENT DOCUMENTS

| 4,406,928 A | * | 9/1983 | MacKenzie | 379/454 |
| 6,956,172 B2 | * | 10/2005 | Dinh | 174/58 |
| 2006/0175490 A1 | * | 8/2006 | Ware et al. | 248/218.4 |

* cited by examiner

*Primary Examiner* — Anthony Stashick
*Assistant Examiner* — Elizabeth Volz
(74) *Attorney, Agent, or Firm* — The Hecker Law Group, PLC

(57) ABSTRACT

An external power supply support system includes an enclosure with indentations spanning its top and side surfaces in a substantially horizontal fashion, and a caddy with a shell-like body configured to engage at least a portion of the indented power supply enclosure. The shell-like caddy body is provided with mounting apertures spaced according to standard rack rail aperture spacing. The mounting apertures emanate from a series of integral structures bulging from the bottom surface of the shell-like caddy body. The bulging aperture structures in combination with several integral structural ribs are configured collectively to provide a substantially flat and elevated interface suitable for secure mounting of the caddy to a support surface.

43 Claims, 6 Drawing Sheets

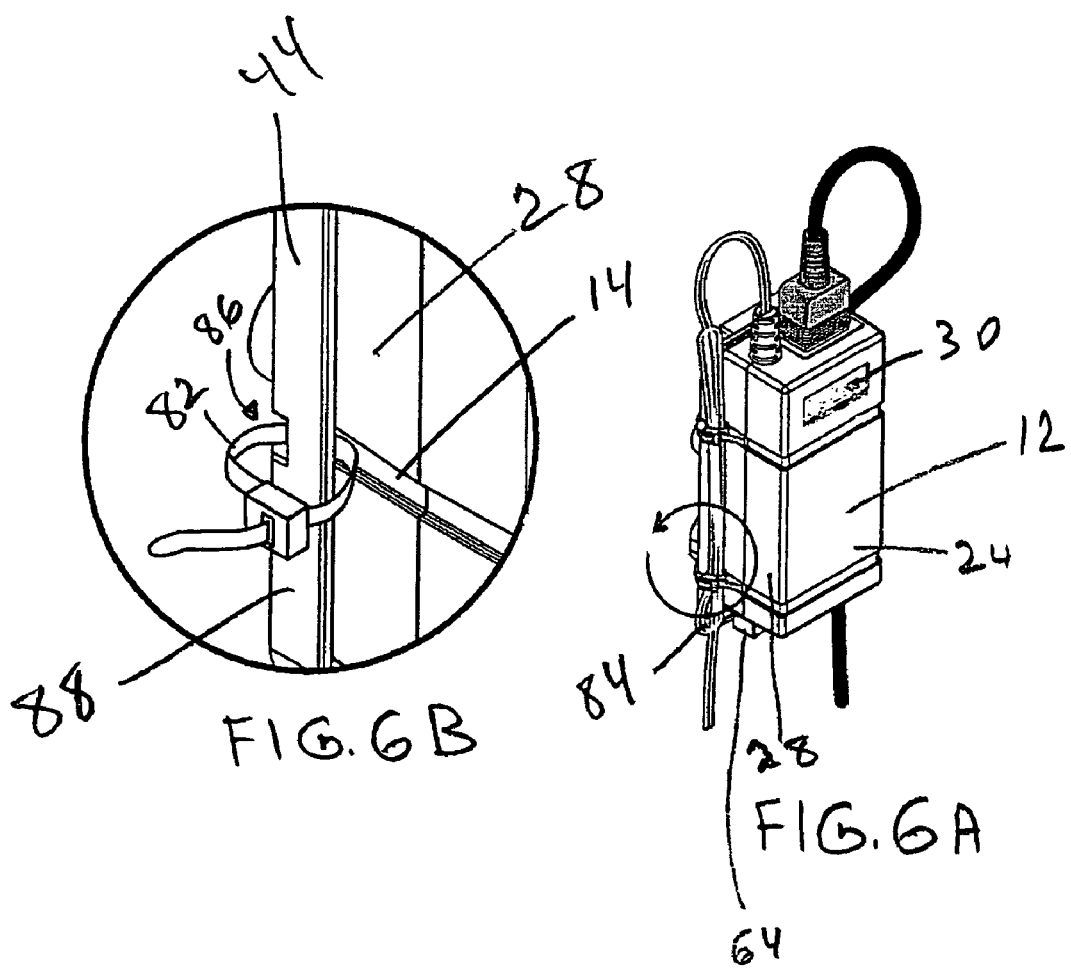

POWER SUPPLY SUPPORT SYSTEM

FIELD OF THE INVENTION

The present invention relates to equipment support systems. More specifically, the invention relates to an external power supply support system and method.

BACKGROUND

External power supplies have traditionally been fastened to support structures using Velcro®-type straps or double-sided tape. These types of fasteners, however, become unreliable over extended periods of time as heat emanated from the power supply during operation tends to weaken the adhesive or gripping power of the fasteners. The end result is inevitably an external power supply hanging from its own power cables. This may result in accidental or undesirable interruption in the operation of electronic equipment being powered by conventionally mounted external power supplies. Such unwarranted interruption may result in loss of valuable data and/or embarrassment to the user during a presentation before an audience.

Moreover, traditional means to mount external power supplies do not provide mounting capability to all types of support structures, such as inside a podium. The need exists, therefore, to mount an external power supply in a more secure and reliable manner to a variety of support structures so as to avoid any interruption in the operation of equipment powered by the external supply.

SUMMARY OF THE INVENTION

Some embodiments disclosed herein are generally directed to a power supply support system. In accordance with one aspect of the present invention, the power supply support system comprises a caddy configured for secure mounting to at least one support surface, and a power supply enclosure releasably engaged by the securely mounted caddy.

In accordance with another aspect of the present invention, the power supply support system comprises an enclosure for an external power supply. The power supply enclosure includes at least one indentation spanning its top and side surfaces in a substantially horizontal fashion.

The power supply support system also comprises a caddy with a shell-like body configured to engage at least a portion of the power supply enclosure. The shell-like body of the caddy is provided with a plurality of mounting apertures spaced according to standard rack rail aperture spacing. The mounting apertures emanate from a series of integral structures bulging from the bottom surface of the shell-like body. The bulging aperture structures in combination with a plurality of integral structural ribs are configured collectively to provide a substantially flat and elevated interface suitable for mounting the caddy to a support surface.

Other embodiments disclosed herein are generally directed to a power supply support method. In accordance with one aspect of the present invention, the power supply support method comprises the steps of:

providing an enclosure for an external power supply;
indenting the external power supply enclosure across its top and side surfaces in a substantially horizontal fashion;
configuring a caddy to releasably engage at least a portion of the indented power supply enclosure;
providing the caddy with a plurality of mounting aperture structures spaced according to standard rack rail aperture spacing; and
utilizing the mounting aperture structures to provide a substantially flat and elevated interface suitable for mounting the caddy to a support surface.

These and other aspects of the invention will become apparent from a review of the accompanying drawings and the following detailed description of the invention.

BRIEF DESCRIPTION OF THE DRAWINGS

The present invention is generally shown by way of reference to the accompanying drawings in which:

FIG. 6A is a perspective view of a cable strain relief assembly for use with the external power supply support system of FIG. 1A; and FIG. 6B is an enlarged fragmentary view of the cable strain relief assembly of FIG. 6A.

DETAILED DESCRIPTION OF THE INVENTION

The detailed description set forth below in connection with the appended drawings is intended as a description of illustrated exemplary embodiments and is not intended to represent the only forms in which these embodiments may be constructed and/or utilized. The description sets forth the functions and sequence of steps for constructing and operating the present invention in connection with the illustrated embodiments. However, it is to be understood that the same or equivalent functions and/or sequences may be accomplished by different embodiments that are also intended to be encompassed within the spirit and scope of the present invention.

Some embodiments of the present invention will be described in detail with reference to an external power supply support system and method, as generally depicted in reference to FIGS. 1-6B. Additional embodiments, features and/or advantages of the invention will become apparent from the ensuing description or may be learned by practicing the invention. In the attached figures, the various drawings are not to scale with like numerals referring to like features throughout both the drawings and the description.

FIG. 1A is a perspective view of an external power supply support system 10 in accordance with one embodiment of the present invention. Support system 10 includes a generally box-like enclosure 12 for an external power supply which may be used to power various electronic components. For example, enclosure 12 may be configured to house a 9V, 12V or 15V external power supply, as needed. Power supply enclosure 12 may be made of plastic and/or other suitable material(s).

Figure 3:
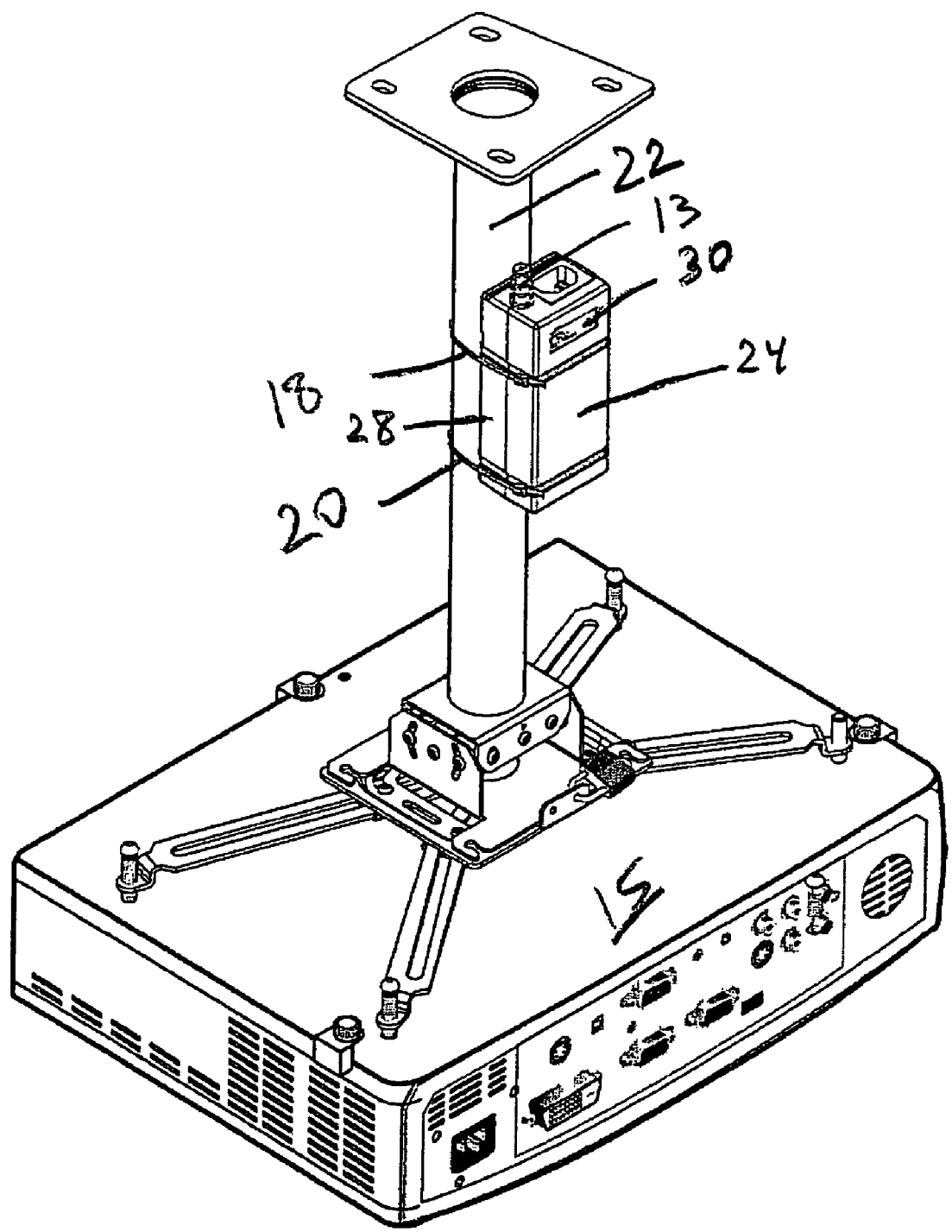
FIG. 3 is a perspective view a pole-mountable enclosure for an external power supply in accordance with another embodiment of the present invention.

In one embodiment, external power supply enclosure 12 is provided with two generally parallel channels or indentations 14, 16 (FIGS. 1A-1B, 1F-1G) which accommodate straps 18, 20 for securely fastening enclosure 12 to an elongated member 22, as generally illustrated in reference to FIG. 3. Elongated member 22 may be a pole, a table leg, a stand leg or any other suitable support structure. In this case, secured enclosure 12 houses an external power supply 13. Pole 22 may be coupled to the underside of an electronic device 15 (FIG. 3). Straps 18, 20 may be configured as plastic zip ties, tie wraps or any other suitable fastener, as needed.

Indentations 14, 16 span the top and side surfaces 24, 26 and 28, respectively, of power supply enclosure 12 in a generally horizontal fashion, as generally illustrated in reference to FIGS. 1A-1B, 1F-1G, 3. Indentations 14, 16 are strategically spaced apart to allow secure fastening of the top and bottom portions of enclosure 12 to pole 22. Other indentation configurations may be utilized, as desired, provided there is no departure from the intended scope of the present invention. For example, external power supply enclosure 12 may be provided with more than two strap channels or with just one centrally disposed channel. Top surface 24 of power supply enclosure 12 may also include a portion 30 which is suitable for application of logo or other insignia, as generally shown in reference to FIGS. 1A, 1F, 2-3, 6A.

Figure 1:
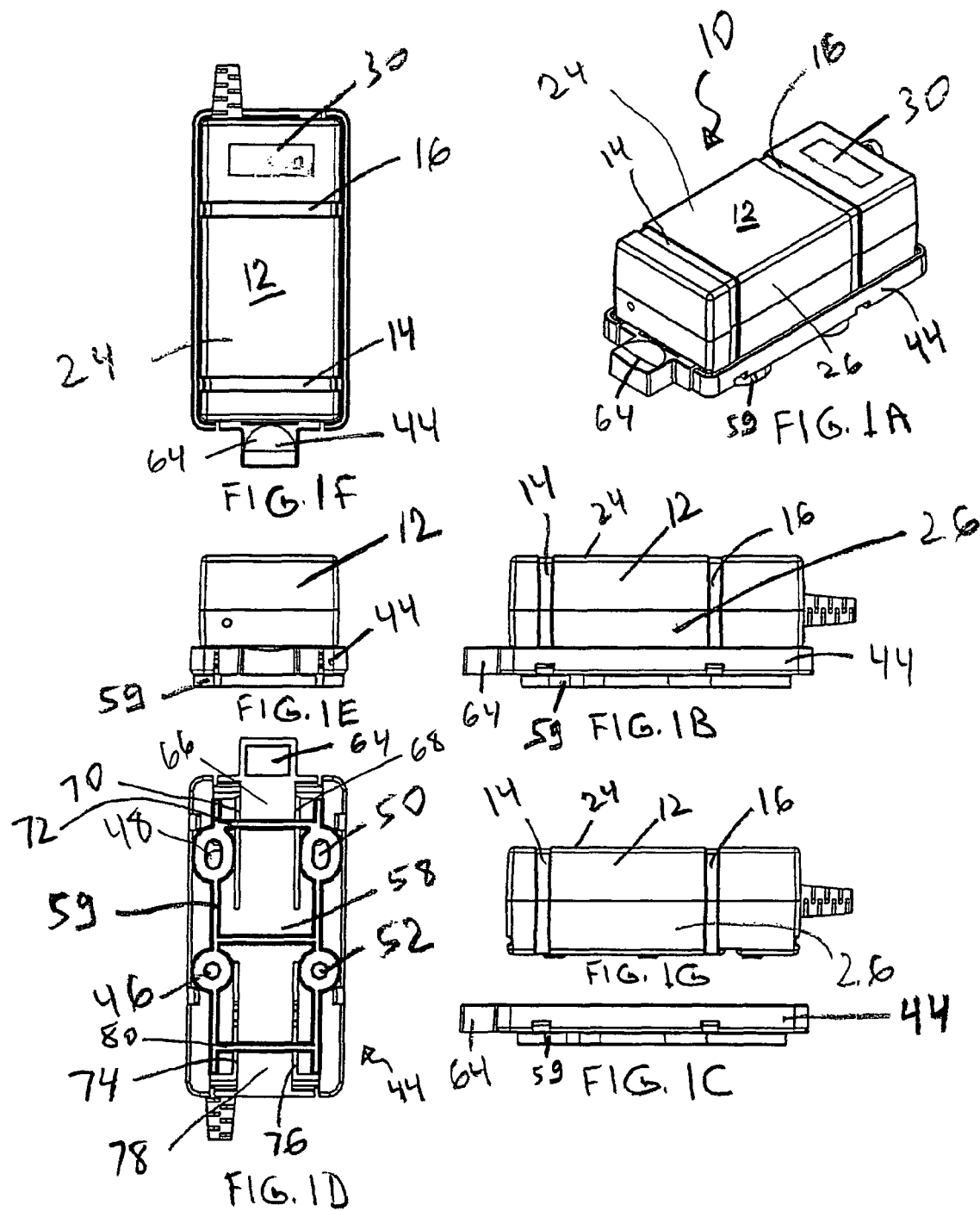
FIG. 1A is a perspective view of an external power supply support system in accordance with one embodiment of the present invention.
FIG. 1B is a side elevation of the external power supply support system of FIG. 1A.
FIG. 1C is a side elevation of one component of the external power supply support system of FIG. 1A.
FIG. 1D is a bottom elevation of the external power supply support system of FIG. 1A.
FIG. 1E is a front elevation of the external power supply support system of FIG. 1A.
FIG. 1F is a top elevation of the external power supply support system of FIG. 1A.
FIG. 1G is a side elevation of another component of the external power supply support system of FIG. 1A.
Figure 2:
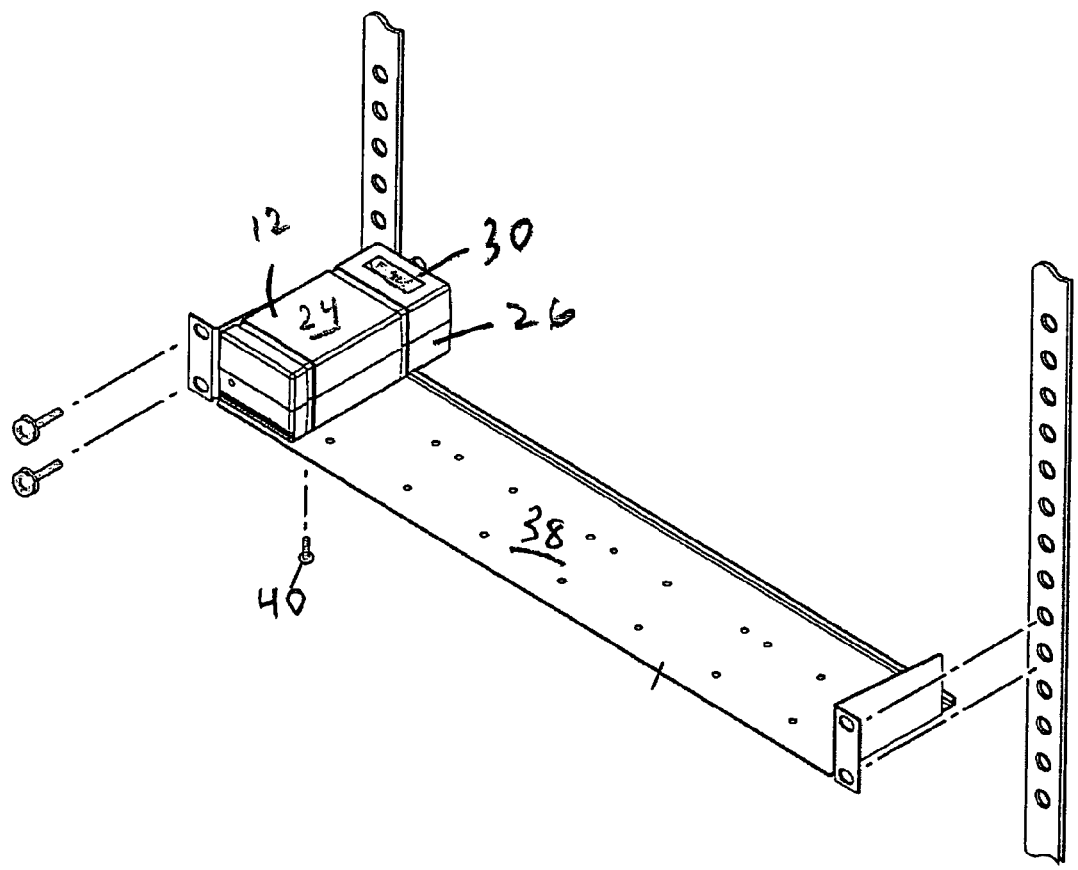
FIG. 2 is a perspective view a rack-mountable enclosure for an external power supply in accordance with one embodiment of the present invention.
Figure 4:
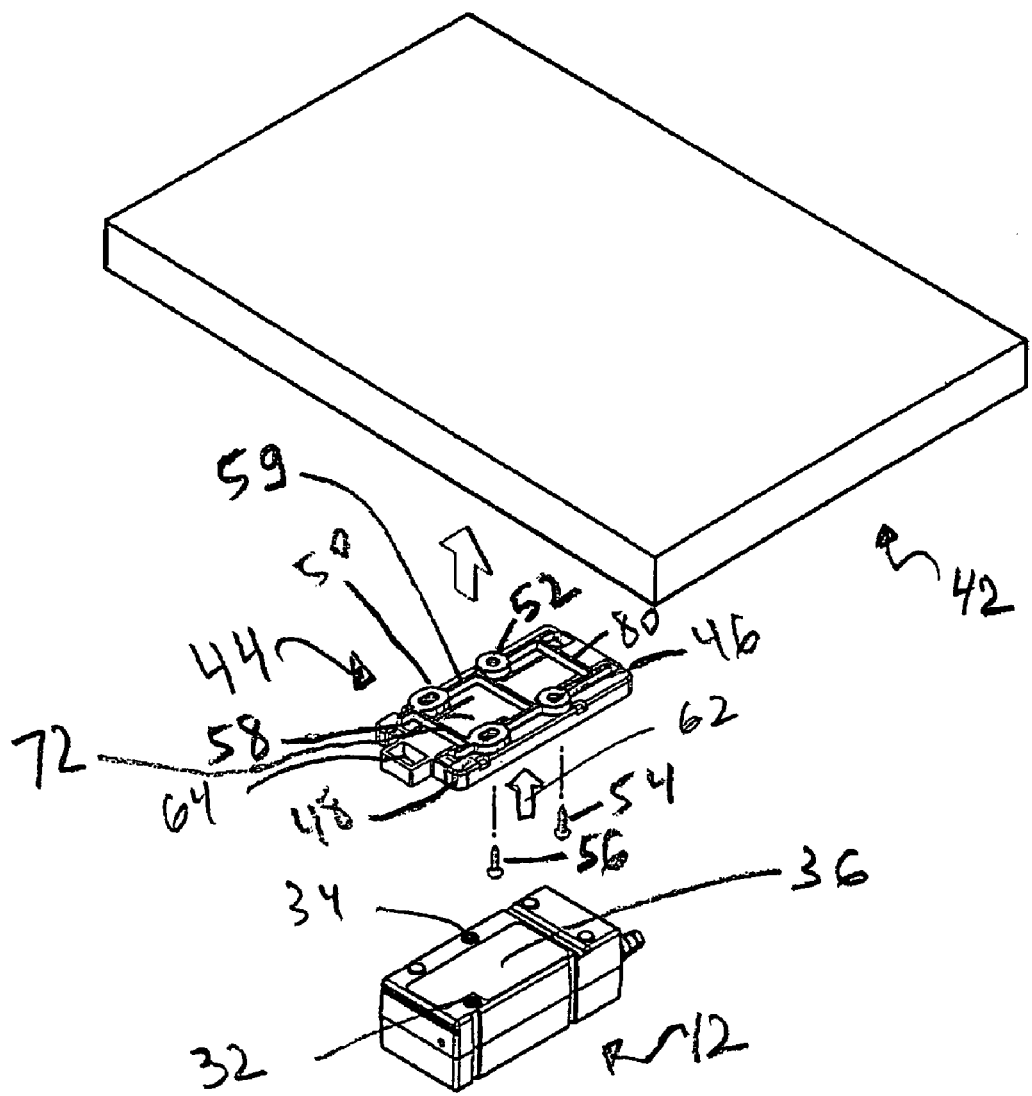
FIG. 4 is an exploded perspective view of a surface-mountable support system for an external power supply in accordance with one embodiment of the present invention.

In another embodiment, external power supply enclosure 12 is provided with two female-threaded metal inserts 32, 34 which are embedded in a bottom portion 36 of power supply enclosure 12, as generally depicted in reference to FIG. 4. Metal inserts 32, 34 (FIG. 4) may be used to securely mount power supply enclosure 12 directly to a rack shelf 38 via male-threaded fasteners, such as screw 40, as generally shown in FIG. 2. The number of embedded inserts may be varied, as needed. Embedded inserts 32, 34 (FIG. 4) may be manufactured of any suitable material or combination of materials.

In yet another embodiment, enclosure 12 may be securely mounted to a support surface 42 via an appropriately configured power supply caddy 44, as generally illustrated in reference to FIG. 4. Particularly, power supply caddy 44 is provided with a plurality of apertures 46, 48, 50, 52 (FIGS. 1D, 4) to accommodate fasteners (such as screws, bolts or the like) 54, 56 (FIG. 4) which are used to mount caddy 44 to support surface 42. A person skilled in the art would appreciate that the number of apertures and/or fasteners used may be varied, as needed. Power supply caddy 44 may be made of plastic and/or other suitable material(s).

Apertures 46, 48, 50, 52 emanate from a series of respective symmetrically spaced integral structures bulging from bottom surface 58 of caddy 44. Bulging aperture structures in combination with a plurality of integral structural ribs are configured collectively to provide a generally flat and elevated interface 59 (FIGS. 1A-1E, 4) suitable for mounting caddy 44 to support surface 42 (FIG. 4). Other aperture configurations may be used in accordance with the general principles of the present invention. In one embodiment, caddy apertures 46, 48, 50, 52 are spaced according to standard rack rail aperture spacing to allow problem-free mounting of caddy 44 to rear rack rail 45 via one or more fasteners (screws, bolts or the like), such as fastener 47, as generally illustrated in reference to FIG. 5. This setup would be convenient whenever there is no room in the front to accommodate a rack shelf for mounting power supply enclosure 12.

Top portion 60 (FIG. 5) of power supply caddy 44 has a shell-like configuration adapted to frictionally engage bottom portion 36 of enclosure 12, as generally shown by directional arrow 62 in FIG. 4. In one embodiment, bottom portion 36 of enclosure 12 is securely retained within shell-like top portion 60 (FIG. 5) of power supply caddy 44 via snap action. In this case, power supply caddy 44 would have already been securely mounted to surface 42 via fasteners 54, 56 (FIG. 4).

Power supply enclosure 12 may be disengaged from shell-like top portion 60 (FIG. 5) of caddy 44 by the user pressing down (away from retained bottom portion 36 of enclosure 12) on integral caddy tab 64 (FIG. 4). Tab 64 has a generally tongue-like body 66 which is disposed between apertures 48, 50 and separated on each side from the rest of the shell-like structure of top caddy portion 60 by symmetrically spaced cutouts 68, 70, as generally depicted in reference to FIG. 1D. Tongue-like tab 64 is adapted to flex away from bottom portion 36 of enclosure 12 via an integral crosswise structural rib 72 (FIGS. 1D, 4). In this regard, tab 64 is advantageously disposed at higher elevation than aperture interface 59 (FIGS. 1A-1E, 4) to allow sufficient flexing clearance when power supply caddy 44 is mounted to support surface 42 (FIG. 4). Crosswise structural rib 72 is part of aperture interface 59 (FIG. 1D).

Figure 5:
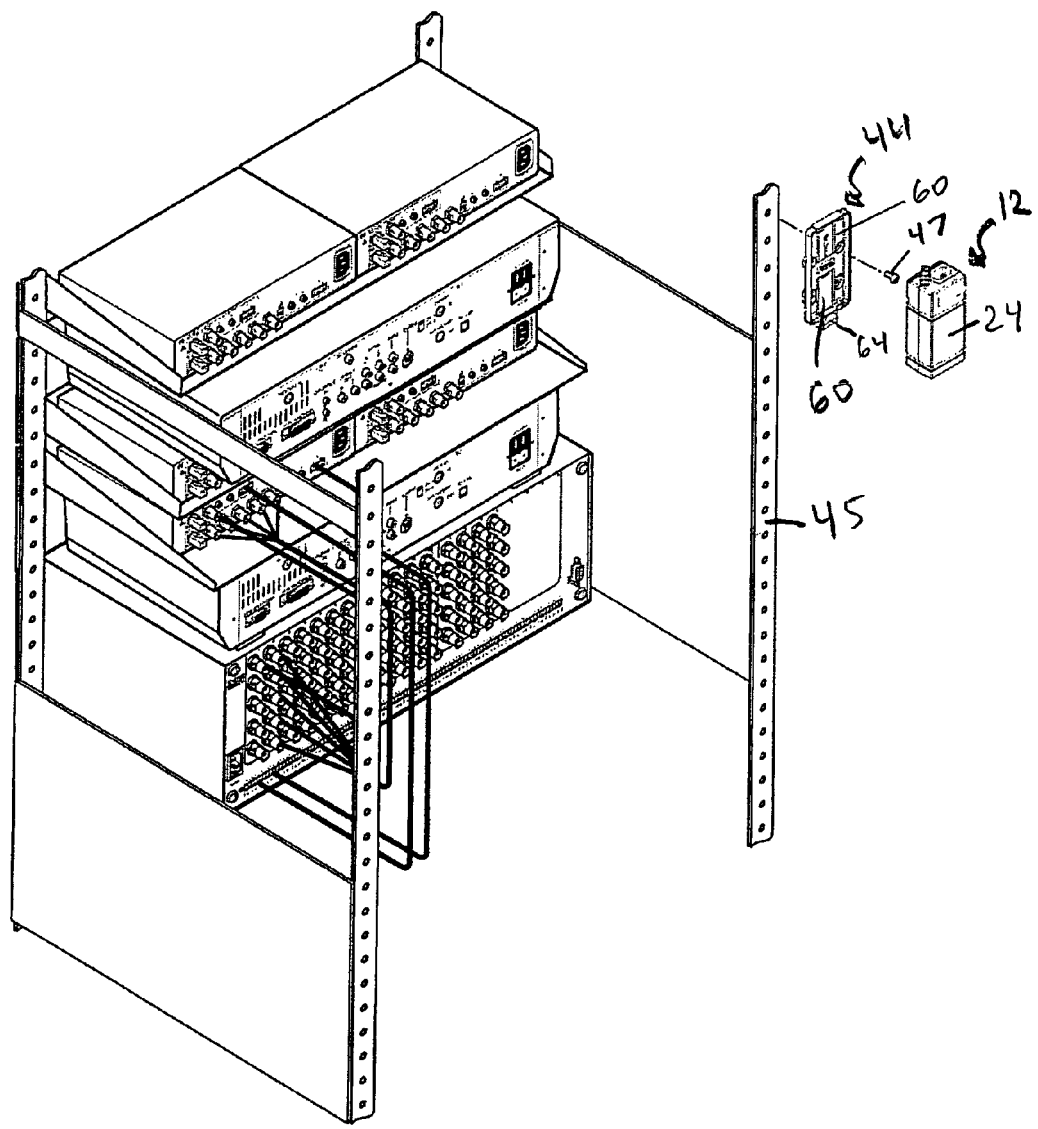
FIG. 5 is an exploded perspective view of a rack-mountable support system for an external power supply in accordance with another embodiment of the present invention.

On the opposite side, another pair of symmetrically spaced cutouts 74, 76 outline a generally T-shaped integral member 78 of shell-like top portion 60 (FIG. 5) of caddy 44. T-shaped member 78 is configured to flex on a respective integral crosswise structural rib 80 (FIGS. 1D, 4). Crosswise structural rib 80 is substantially parallel to crosswise structural rib 72, as generally depicted in reference to FIGS. 1D and 4. Crosswise structural rib 80 is also part of aperture interface 59 (FIG. 1D). T-shaped member 78 facilitates disengagement of power supply enclosure 12 from caddy 44 by flexing, as needed, when tab 64 is pressed down by the user. Tab 64 and T-shaped member 78 also facilitate engagement of bottom portion 36 of power supply enclosure 12 by flexing accordingly as bottom enclosure portion 36 snaps into shell-like top caddy portion 60 (FIG. 5).

With power supply enclosure 12 securely snapped into shell-like top portion 60 of caddy 44, the user may utilize tie wrap or zip tie 82 (FIG. 6B) or other suitable strapping, as needed, to secure power supply cabling 84 (FIG. 6A) to one side of caddy 44 through one or more integral cutouts, such as cutout 86 in FIG. 6B, on an outer edge 88 of caddy 44. Cabling 84 may include AC and DC power cables from the external power supply housed in enclosure 12. Each outer edge cutout on caddy 44 is configured to line up with a corresponding surface indentation on enclosure 12. In this regard, FIG. 6B depicts cutout 86 generally coinciding with enclosure indentation 14 to allow the threading of zip tie 82.

A person skilled in the art would readily recognize that the present invention provides a multifunctional, interchangeably-mountable power supply support system. Particularly, the provision of caddy 44 for external power supply enclosure 12 allows easy and reliable mounting of the power supply to surfaces where there would normally be no other reliable means of mounting. The conventional use of Velcro®-type straps or double-sided tape (which become unreliable over extended periods of time) as mounting means is advantageously avoided. The external power supply support system of the present invention may be easily mounted inside a podium or to any other structure, as needed.

In one exemplary embodiment, external power supply enclosure 12 is configured as a rack-mountable unit of 1 U height and ⅛ rack width. "U" is a standard unit of measure for designating vertical usable space such as height of racks. This unit of measurement refers to the space between shelves on a rack. 1 U equals 1.75 inches. Other suitable power supply enclosure configurations may be employed, as desired.

A person skilled in the art would also recognize that the various embodiments described hereinabove are merely illustrative of the general principles of the present invention. Various design or system modifications may be utilized as long as such modifications reside within the scope of the invention. For example, the power supply caddy of the present invention may be readily modified for use with a variety of other equipment. Thus, by way of example, but not of limitation, various alternative configurations may be utilized in accordance with the teachings herein. Accordingly, the drawings and description are illustrative and not meant to be a limitation thereof.

Moreover, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Thus, it is intended that the invention cover all embodiments and variations thereof as long as such embodiments and variations come within the scope of the appended claims and their equivalents.

What is claimed is:

1. A power supply support system, comprising:
   a caddy configured for secure mounting to at least one support surface, said caddy including a top portion configured to frictionally engage at least a portion of a power supply enclosure, said caddy top portion being configured substantially as a shell, said shell-like top portion of said caddy including at least one integral cutout on its outer edge; and
   the power supply enclosure releasably engaged by said securely mounted caddy, said power supply enclosure including a bottom portion configured to engage said shell-like top portion of said securely mounted caddy, said power supply enclosure being provided with at least one indentation across its top and side surfaces, said bottom portion of said power supply enclosure being securely retained within said shell-like top portion of said securely mounted caddy.

2. The power supply support system of claim 1, wherein said caddy is provided with at least one aperture.

3. The power supply support system of claim 2, wherein said at least one caddy aperture is configured to accommodate at least one fastener for securely mounting said caddy to a support surface.

4. The power supply support system of claim 3, wherein said support surface is a rear rack rail.

5. The power supply support system of claim 1, wherein said bottom portion of said power supply enclosure is configured to mount said power supply enclosure to a support surface without using said caddy.

6. The power supply support system of claim 5, wherein said bottom portion of said power supply enclosure is embedded with at least one female-threaded insert.

7. The power supply support system of claim 6, wherein said at least one female-threaded insert is used in combination with at least one male-threaded fastener to securely mount said power supply enclosure to a support surface without using said caddy.

8. The power supply support system of claim 7, wherein said at least one female-threaded insert is made of metal.

9. The power supply support system of claim 7, wherein said support surface is a rack shelf.

10. The power supply support system of claim 1, wherein said at least one indentation is configured to accommodate strapping for fastening said power supply enclosure to an elongated member without using said caddy.

11. The power supply support system of claim 10, wherein said elongated member is a pole.

12. The power supply support system of claim 10, wherein said elongated member is a table leg.

13. The power supply support system of claim 10, wherein said elongated member is a stand leg.

14. The power supply support system of claim 10, wherein said at least one integral cutout is configured to line up with said at least one indentation to allow the threading of at least one fastener strip there through when said bottom portion of said power supply enclosure is retained within said shell-like top portion of said caddy.

15. The power supply support system of claim 14, wherein said at least one fastener strip is threaded to secure cabling from a power supply housed in said enclosure.

16. The power supply support system of claim 15, wherein said at least one fastener strip is of the zip tie type.

17. The power supply support system of claim 1, wherein said shell-like top portion of said caddy is provided with at least one integral tab configured to flex away from said retained power supply enclosure when pressed in the same direction by a user.

18. The power supply support system of claim 17, wherein said at least one integral tab is utilized by the user to disengage said power supply enclosure from said shell-like top portion of said caddy.

19. The power supply support system of claim 18, wherein said at least one integral tab includes a tongue-like body which flexes away from said retained power supply enclosure via a first crosswise structural rib on said shell-like top portion of said caddy.

20. The power supply support system of claim 19, wherein said shell-like top portion of said caddy is further provided with at least one substantially T-shaped integral member which is configured to flex away from said retained power supply enclosure when said power supply enclosure is being disengaged from said shell-like top portion of said caddy.

21. The power supply support system of claim 20, wherein said at least one substantially T-shaped integral member flexes away from said retained power supply enclosure via a second crosswise structural rib on said shell-like top portion of said caddy.

22. The power supply support system of claim 21, wherein said second crosswise structural rib is substantially parallel to said first crosswise structural rib.

23. The power supply support system of claim 22, wherein said at least one substantially T-shaped integral member and said at least one integral tab facilitate engagement of said bottom portion of said power supply enclosure by flexing accordingly as said bottom portion of said power supply enclosure snaps into said shell-like top portion of said caddy.

24. The power supply support system of claim 22, wherein said caddy is provided with a plurality of apertures spaced according to standard rack rail aperture spacing.

25. The power supply support system of claim 24, wherein the standard spacing of said plurality of apertures allows secure mounting of said caddy to a rear rack rail with the use of corresponding fasteners.

26. The power supply support system of claim 24, wherein said apertures emanate from a series of integral structures bulging from the bottom surface of said caddy.

27. The power supply support system of claim 26, wherein said bulging aperture structures in combination with a plurality of integral structural ribs are configured collectively to provide a generally flat and elevated interface suitable for mounting said caddy to a support surface.

28. The power supply support system of claim 27, wherein said support surface is a rack shelf.

29. The power supply support system of claim 27, wherein said at least one integral tab is disposed at higher elevation than said aperture interface.

30. The power supply support system of claim 29, wherein said higher elevation disposition of said at least one integral tab allows sufficient flexing clearance for said at least one integral tab when said caddy is securely mounted to said support surface.

31. The power supply support system of claim 27, wherein said plurality of integral ribs includes said first and second crosswise structural ribs.

32. A power supply support system, comprising:
an enclosure for an external power supply, said power supply enclosure including at least one indentation spanning its top and side surfaces in a substantially horizontal fashion; and
a caddy with a shell-like body configured to engage at least a portion of said power supply enclosure, said shell-like body being provided with a plurality of mounting apertures spaced according to standard rack rail aperture spacing, said mounting apertures emanating from a series of integral structures bulging from the bottom surface of said shell-like body, wherein said bulging aperture structures in combination with a plurality of integral structural ribs are configured collectively to provide a substantially flat and elevated interface suitable for mounting said caddy to a support surface;
said at least one indentation being configured to accommodate strapping for fastening said power supply enclosure to an elongated member without using said caddy.

33. The power supply support system of claim 32, wherein said external power supply enclosure further includes a bottom portion which is embedded with at least one female-threaded insert.

34. The power supply support system of claim 33, wherein said at least one female-threaded insert is used in combination with at least one male-threaded fastener to securely mount said external power supply enclosure to a support surface without using said caddy.

35. The power supply support system of claim 32, wherein said shell-like body of said caddy includes at least one integral cutout on its outer edge.

36. The power supply support system of claim 35, wherein said at least one integral cutout is configured to line up with said at least one indentation to allow the threading of at least one fastener strip there through when a portion of said power supply enclosure is engaged within said shell-like body of said caddy.

37. The power supply support system of claim 36, wherein said at least one fastener strip is threaded to secure cabling from an external power supply housed in said enclosure.

38. The power supply support system of claim 37, wherein said at least one fastener strip is a zip tie.

39. The power supply support system of claim 32, wherein said shell-like body of said caddy is further provided with at least one integral tab configured to flex away from said engaged power supply enclosure when pressed in the same direction by a user.

40. The power supply support system of claim 39, wherein said at least one integral tab is utilized by the user to disengage said external power supply enclosure from said shell-like body of said caddy.

41. The power supply support system of claim 40, wherein said at least one integral tab includes a tongue-like body which flexes away from said engaged enclosure via a first crosswise structural rib on said shell-like body of said caddy.

42. The power supply support system of claim 41, wherein said at least one flexing tab is disposed at higher elevation than said aperture interface.

43. The power supply support system of claim 42, wherein said higher elevation disposition of said at least one tab allows sufficient flexing clearance for said at least one tab when said caddy is securely mounted to said support surface.

* * * * *